(12) United States Patent
Haraguchi

(10) Patent No.: US 7,312,541 B2
(45) Date of Patent: Dec. 25, 2007

(54) ACTUATOR AND BONDING APPARATUS

(75) Inventor: Manabu Haraguchi, Yokohama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 77 days.

(21) Appl. No.: 11/044,520

(22) Filed: Jan. 27, 2005

(65) Prior Publication Data

US 2005/0184600 A1 Aug. 25, 2005

(30) Foreign Application Priority Data

Jan. 28, 2004 (JP) ............... 2004-020435

(51) Int. Cl.
*H02K 33/00* (2006.01)
*B23K 37/04* (2006.01)
*H02K 33/12* (2006.01)
*H02K 35/02* (2006.01)
*H01L 21/68* (2006.01)

(52) U.S. Cl. .............. 310/12; 228/47.1; 74/489.08; 310/20

(58) Field of Classification Search .......... 310/12, 310/20; 74/489.08
See application file for complete search history.

(56) References Cited

U.S. PATENT DOCUMENTS 4,289,181 A * 9/1981 Capuano ............... 310/49 R
6,286,749 B1 * 9/2001 Lee et al. ............... 228/102
6,460,751 B1 10/2002 Thurlemann
6,513,233 B1 * 2/2003 Nakao et al. ............ 29/740
6,622,586 B2 * 9/2003 Scheidegger et al. .... 74/490.08

FOREIGN PATENT DOCUMENTS

JP 2002-329772 11/2002

\* cited by examiner

*Primary Examiner*—Burton Mullins
(74) *Attorney, Agent, or Firm*—William L. Androlia; H. Henry Koda

(57) ABSTRACT

In an actuator of a bonding apparatus, a rotating body 16 that has a bonding head is rotatably supported on a supporting carrier having the same shape as magnetic path members 32L and 32R, and coil portions 40 and 42 are disposed on both outer sides of this supporting carrier. Rectilinear magnetic fields created by the coil portions 40 and 42 and a circumferential magnetic field created by permanent magnets of the rotating body 16 act cooperatively via magnetic path members 32L and 32R in which a plurality of magnetic paths are formed, so that the rotating body 16 makes a movement combining rotation and a linear movement along the Y axis in accordance with the respective driving of the coil portions 40 and 42. The rotating body 16 is movable along the X and Y axes by the shape of the magnetic paths of the magnetic path members.

11 Claims, 8 Drawing Sheets

| | $y_1$ | $y_2$ | Y | θ |
|---|---|---|---|---|
| ADVANCE | +a | +a | +a | 0 |
| RETRACTION | −a | −a | −a | 0 |
| CLOCKWISE ROTATION | +b | −b | 0 | $+b/r$ |
| COUNTERCLOCKWISE ROTATION | −b | +b | 0 | $-b/r$ |
| LINEAR ADVANCE + ROTATION | +a | +b | $\dfrac{a+b}{2}$ | $+\dfrac{a-b}{r}$ |

|  | $y_1$ | $y_2$ | Y | θ |
|---|---|---|---|---|
| ADVANCE | +a | +a | +a | 0 |
| RETRACTION | −a | −a | −a | 0 |
| CLOCKWISE ROTATION | +b | −b | 0 | +b/r |
| COUNTERCLOCKWISE ROTATION | −b | +b | 0 | −b/r |
| LINEAR ADVANCE + ROTATION | +a | +b | $\frac{a+b}{2}$ | $+\frac{a-b}{r}$ |

FIG. 3B

|  | $y_{RU}$ | $y_{RD}$ | $y_{LU}$ | $y_{LD}$ | X | Y |
|---|---|---|---|---|---|---|
| Y ADVANCE | +a | +a | +a | +a | 0 | +a |
| Y RETRACTION | −a | −a | −a | −a | 0 | −a |
| X RIGHT ADVANCE | −b | +b | +b | −b | +b | 0 |
| X LEFT ADVANCE | +b | −b | −b | +b | −b | 0 |
| FORWARD-REARWARD MOVEMENT + LEFT-RIGHT MOVEMENT | +b | +a | +a | +b | $-\dfrac{a-b}{2}$ | $+\dfrac{a+b}{2}$ |

FIG. 6B

ACTUATOR AND BONDING APPARATUS

BACKGROUND OF THE INVENTION

1. Technical Field

The present invention relates to an actuator and a bonding apparatus and more particularly to an actuator which causes an object to move to an arbitrary position and to a bonding apparatus that includes a movement mechanism which causes a bonding part that performs bonding work to move to arbitrary positions.

2. Description of the Related Art

Bonding apparatuses such as wire bonders, die bonders and the like perform bonding work by causing a bonding tool attached to the tip end of a bonding head to move to arbitrary positions in a plane. Most of these bonding apparatuses comprise a so-called XY table in which an X table that is capable of moving only in the X direction and a Y table that is capable of moving only in the Y direction are stacked, and driving sources that drive these respective tables, as shown in Japanese Patent Application Laid-Open (Kokai) No. 2002-329772. In this bonding apparatus, the bonding tool can be moved to arbitrary positions in the XY plane by mounting the bonding head on an XY table, and driving the XY table by means of a driving source.

Furthermore, a technique in which a slide is caused to advance in a linear motion by a linear motor, and a rotary beam on the slide is caused to rotate by s second linear motor so that a capillary mounted on the rotary beam is positioned, is disclosed in U.S. Pat. No. 6,460,651.

There has been an increasing demand for high speed in bonding apparatuses; accordingly, there is a demand for high-speed positioning of the bonding head in arbitrary positions. From this standpoint, the prior art has the following problems:

In an XY table driving system, since the XY table has a stacked structure, the weight and inertia of the system tend to be large, so that there may be cases in which it is difficult to achieve the acceleration that is required for high-speed performance. Furthermore, depending on the position of the upper table, the driving source that drives the lower table may be unable to push against the center of gravity of the table, so that an unnecessary torque is generated. Accordingly, there may be cases in which the load on the guide mechanism such as the linear guide or the like is increased, so that high-speed positioning is hindered.

In the slide and rotary system disclosed in the U.S. Pat. No. 6,460,651, the response of the rotational movement is generally faster than the response of the linear movement. Accordingly, the high-speed characteristics tend to be improved compared to those of an XY table driving system. However, when the slide makes a linear movement, the rotational driving source makes no contribution to the propulsion in the X direction. Furthermore, in cases where it is attempted to mount the rotational driving source on the slide, this also acts in a direction that reduces the linear acceleration in the X direction.

In such prior art, since a moving mechanism with a stacked structure is used in order to obtain movement with two degrees of freedom in the case of movement to an arbitrary position in the plane, there may be limits to the extent that the required acceleration can be achieved. In some cases, as a result of the presence of one driving source, there may be an action working in a direction that reduces the acceleration in other driving.

SUMMARY OF THE INVENTION

The object of the present invention is to solve such problems encountered in the prior art and to provide an actuator and bonding apparatus which allow faster movement to arbitrary positions.

The above object is accomplished by a unique structure of the present invention for an actuator that includes:

- a rotating body which can rotate and advance linearly along a specified linear-advance axis,
- a movable element side magnetism generating element which is disposed on the rotating body,
- a supporting carrier which supports the rotating body so that the rotating body is free to rotate, the supporting carrier being movable along the linear-advance axis together with the rotating body,
- a fixed element side magnetism generating element which is disposed along a direction of the linear-advance axis on an outside of the supporting carrier, and
- a magnetic path member which is disposed on the supporting carrier and has a plurality of magnetic paths that are formed between a circumferential magnetic field that is created by the movable element side magnetism generating element and a rectilinear magnetic field of the fixed element side magnetism generating element; and
- in this structure, the above-described rotating body is caused to make a movement combining a linear advance and rotation by a cooperative action of a magnetic field created by the movable element side magnetism generating element and a magnetic field created by the fixed element side magnetism generating element.

The above object is accomplished by a unique structure of the present invention for an actuator that includes:

- a planar movement body that is capable of moving within a specified plane,
- a movable element side magnetism generating element which is installed on the planar movement body along a first axial direction within a specified plane,
- a supporting carrier which has a guide portion that guides the planar movement body in the first axial direction, the supporting carrier being capable of moving along with the planar movement body in a second axial direction while guiding a movement of the planar movement body, the second axial direction being the opposite from the first axial direction,
- a fixed element side magnetism generating element which is installed on an outside of the supporting carrier and is disposed in the second axial direction within the specified plane, and
- a magnetic path member which is disposed on the supporting carrier and has a plurality of magnetic paths that are formed between a first magnetic field of the movable element side magnetism generating element and a second magnetic field of the fixed element side magnetism generating element, the first magnetic field being disposed in the first axial direction and the second magnetic field being disposed in the second axial direction; and
- in this structure, the above-described planar movement body is caused to move in a specified plane by a cooperative action of a magnetic field created by the fixed element side magnetism generating element and a magnetic field created by the movable element side magnetism generating element.

The above object is accomplished by still another unique structure of the present invention for an actuator that includes:
- a rotating body which contains a bonding head that performs bonding on a bonding object and which can rotate and advance linearly along a linear-advance axis,
- a movable element side magnetism generating element which is disposed in a circumferential configuration on the rotating body,
- a supporting carrier which supports the rotating body so that the rotating body is free to rotate, the supporting carrier being movable along the linear-advance axis together with the rotating body,
- a set of left and right fixed element side magnetism generating elements which are disposed along a direction of the linear-advance axis on both outer sides of the supporting carrier, and
- a magnetic path member which is disposed on the supporting carrier and has a plurality of magnetic paths that are formed between a circumferential magnetic field that is created by the movable element side magnetism generating element and respective rectilinear magnetic fields of the left and right fixed element side magnetism generating elements; and
- in this structure, the above-described rotating body is caused to make a movement combining a linear advance and rotation by a cooperative action of a magnetic field created by the movable element side magnetism generating element and a magnetic fields created by the left and right fixed element side magnetism generating elements.

The above object is accomplished by still another unique structure of the present invention for an actuator that includes:
- a planar movement body which contains a bonding head that performs bonding on a bonding object and is capable of moving within a specified plane,
- a set of upper and lower movable element side magnetism generating elements which are disposed in parallel on the planar movement body along within a specified plane,
- a supporting carrier which has a guide portion that guides the planar movement body in a first axial direction, the supporting carrier being capable of moving along with the planar movement body in a second axial direction while guiding a movement of the planar movement body, the second axial direction being the opposite from the first axial direction,
- a fixed element side magnetism generating element which is installed on an outside of the supporting carrier and is disposed in second axial direction within the specified plane, and
- a magnetic path member which is disposed on the supporting carrier and has a plurality of magnetic paths that are formed between respective magnetic fields of the upper and lower movable element side magnetism generating elements and a magnetic field of the fixed element side magnetism generating element, the magnetic fields being disposed in the first axial direction and the magnetic field being disposed in the second axial direction; and
- in this structure, the above-described planar movement body is caused to make a movement within the specified plane by a cooperative action of a magnetic field created by the fixed element side magnetism generating element and a magnetic fields created by the upper and lower movable element side magnetism generating elements.

In the above structure, it is preferable that the fixed element side magnetism generating element comprise a set of left and right fixed element side magnetism generating elements that are disposed parallel to the second axial direction.

In the above structure, it is preferable that the magnetic path member be formed by laminating a plurality of magnetic bodies that form magnetic paths and a plurality of non-magnetic bodies that separate the magnetic paths. In addition, it is preferable that the magnetic path member be a magnetic body in which a plurality of slits are formed in a direction that forms magnetic paths and that each of the plurality of slits be filled with a non-magnetic material.

In the present invention, it is preferable that the left and right fixed element side magnetism generating elements or movable element side magnetism generating element be driven by an alternating current. It is also preferable that the movable element side magnetism generating element be a permanent magnet, and the left and right fixed element side magnetism generating elements be electromagnets and that the electromagnets have cores.

In the present invention, it is preferable that the movable element side magnetism generating element comprise a row of permanent magnets disposed in a circumferential configuration around the rotating body, and the left and right fixed element side magnetism generating elements comprise two rows of permanent magnets that are disposed along a direction of the linear-advance axis.

In the present invention, it is also preferable that the movable element side magnetism generating element comprise two rows of permanent magnets that are disposed along the first axial direction, and the left and right fixed element side magnetism generating elements comprise two rows of electromagnets that are disposed along the second axial direction.

In the present invention, it is further preferable that at least one of the rotating body and the supporting carrier be supported by a fluid pressure supporting mechanism and that at least one of the planar movement body and the supporting carrier be supported by a fluid pressure supporting mechanism.

The above-described object is further accomplished by a unique structure of the present invention for a bonding apparatus that include:
- a rotating body which contains a bonding head that performs bonding on a bonding object, the rotating body being able to rotate and advance linearly along a specified linear-advance axis,
- a plurality of permanent magnets that are disposed in a circumferential configuration on the rotating body,
- a supporting carrier which supports the rotating body so that the rotating body is free to rotate, the supporting carrier being able to move together with the rotating body along the linear-advance axis, and
- a set of left and right coils that are disposed along a direction of the linear-advance axis on both outer sides of the supporting carrier; and
- in this structure, the above-described rotating body is caused to make a movement combining a linear advance and rotation by a cooperative action of magnetic fields that are created by causing an electric current to flow to the left and right coils and by magnetic fields of the permanent magnets.

BRIEF DESCRIPTION OF THE DRAWINGS

FIG. 3B shows five examples for the linear motions $y_1$ and $y_2$ of the magnetic pole positions of the coil portions.

FIG. 6B shows five examples of the linear movements of the respective magnetic pole positions.

DETAILED DESCRIPTION OF THE INVENTION

Embodiments of the present invention will be described below in detail with reference to the attached figures. Below, the bonding apparatus will be described as a wire bonder; however, this bonding apparatus may also be a bonding apparatus such as a die bonder, face-down bonder or the like.

Figure 1:
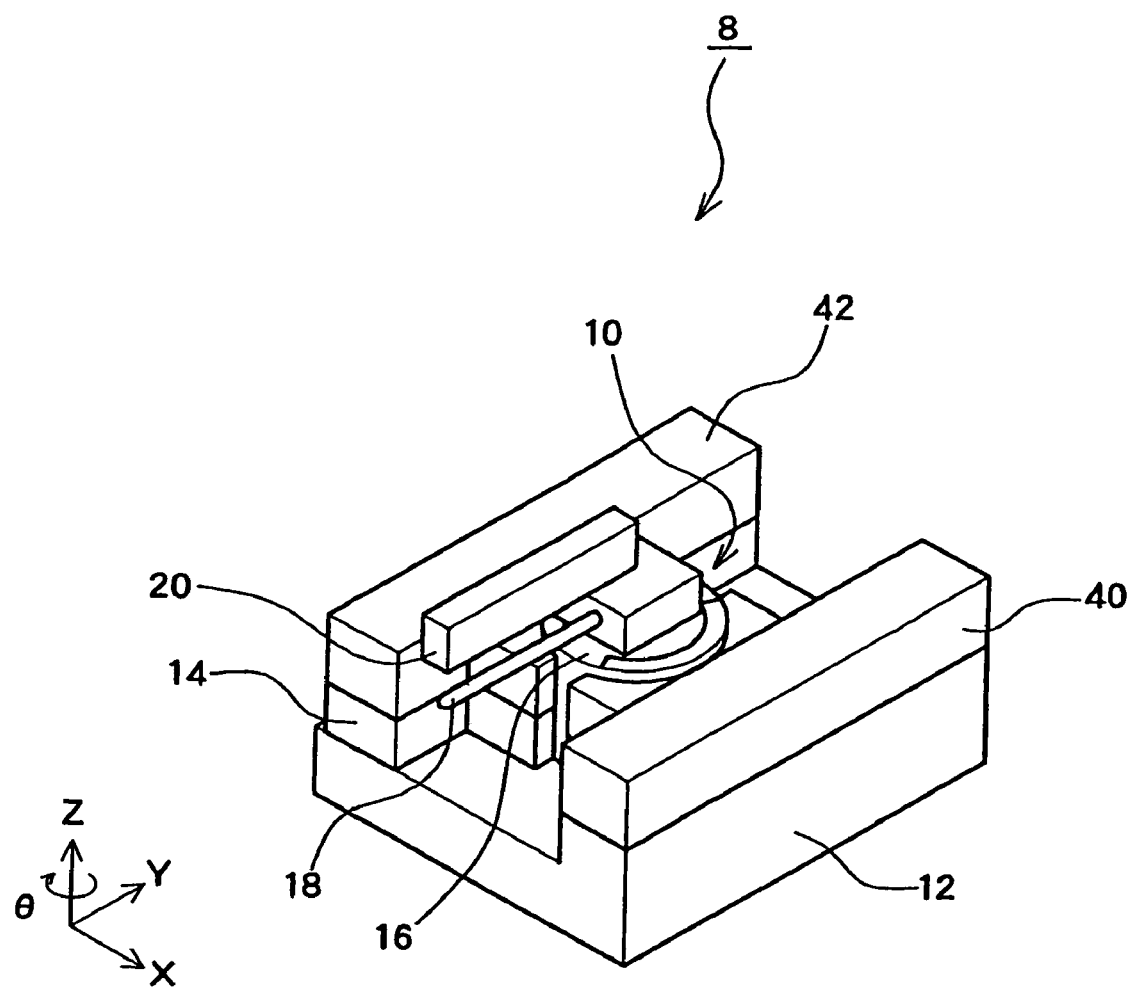
FIG. 1 is a partial diagram of a wire bonder in an embodiment of the present invention, particularly showing the part of the movement mechanism that moves the bonding head.
Figure 2:
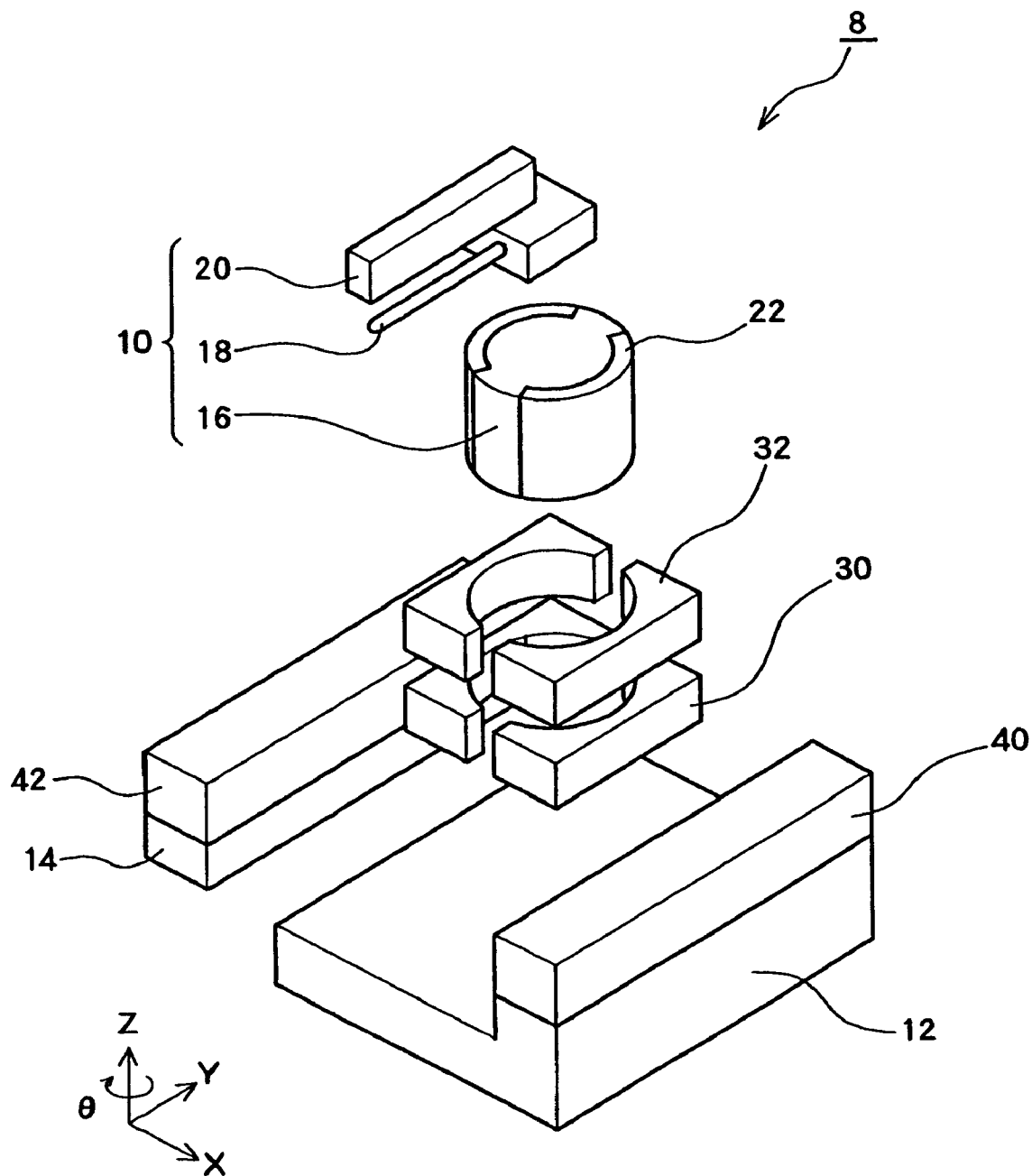
FIG. 2 is an exploded perspective view of FIG. 1.

FIG. 1 is a partial view of the wire bonder 8, particularly showing a portion of the movement mechanism that moves the bonding head 10 to an arbitrary position. FIG. 2 is an exploded perspective view of the same. The portion constituting the movement mechanism of the wire bonder 8 includes a bonding head 10, a supporting carrier 30 which supports the bonding head 10 so that this bonding head 10 is free to rotate, and a stage 12 and side guiding portion 14 which guide the movement of the supporting carrier 30. Right coil portion 40 and left coil portion 42 are installed on the stage 12 and side guiding portion 14, respectively, and circumferential permanent magnets 22 are installed on the bonding head 10. A magnetic path member 32 is stacked on the supporting carrier 30 between the coil portions 40 and 42 and the permanent magnets 22.

The rising wall surface of the stage 12 and the side surface of the side guiding portion 14 that faces this rising wall surface are disposed parallel to each other; in particular, the rising wall surface of the stage 12 is disposed parallel to the direction of the Y axis shown in FIG. 1. The bonding head 10 and supporting carrier 30 are disposed so that these parts are movable in a parallel groove located between the rising wall surface of this stage 12 and the side guiding portion 14. The side guiding portion 14 is pushed in the +X axial direction in FIG. 1 at an appropriate pressure by driving means not shown in the figures. As a result, the bonding head 10, supporting carrier 30 and magnetic path member 32 can be caused to move along the rising wall surface of the stage 12. An appropriate spring or the like can be used as the driving means.

The coil portions 40 and 42 are long members comprising driving coils (located inside) that drive the bonding head 10 in cooperation with the permanent magnet 22. The right coil portion 40 is attached to the upper surface of the rising wall surface of the stage 12 along the direction of the Y axis. Furthermore, the left coil portion 42 is attached to the upper surface of the side guiding portion 14 along the direction of length thereof. A driving current is supplied to the respective coils by a driving control part not shown in the figures. It is desirable that cores be installed in the respective coils, so that the magnetic fields that are generated by driving can be efficiently conducted to the point where a driving force is generated. Accordingly, if the permanent magnets 22 that are installed on the moving bonding head 10 are used as the movable element side magnetism generating elements, then the coil portions 40 and 42 correspond to the fixed element side magnetism generating elements.

The bonding head 10 is constructed from a rotating body 16 which is a cylindrical member with permanent magnets 22 disposed along the circumference, and a bonding tool 18 used for bonding work, positioning camera 20 and the like, which are mounted on the rotating body 16. It is desirable that the center of gravity of the overall bonding head 10 with the bonding tool 18, etc., mounted coincide as far as possible with the rotational axis of the cylindrical shape of the rotating body 16. It is desirable that an appropriate magnetic shield be installed between the bonding tool 18, etc., and the permanent magnets 22.

The rotating body 16 is a cylindrical member, and a bonding tool 18 and other components are mounted on this rotating body 16. The rotating body 16 functions to move in a linear advance along the direction of the Y axis shown in FIGS. 1 and 2 inside the parallel groove located between the stage 12 and the side guiding portion 14 along with the supporting carrier 30 and magnetic path member 32 and to rotate about the Z axis which is the direction of the rotational axis of the rotating body 16. It is desirable that this rotating body 16 be formed from a non-magnetic material with respect to the portions where no magnetic paths are formed. For example, this can be accomplished by the mechanical working of a non-magnetic metal. Furthermore, if there are no problems in terms of rigidity, etc., a plastic, etc., which is formed into a cylindrical shape by injection molding or mechanical working may also be used.

The permanent magnets 22 that are disposed along the circumference of the rotating body 16 are disposed so that the N poles and S poles alternate at arbitrary angular intervals. Such permanent magnets 22 can be obtained by alternately embedding N pole magnet parts and S pole magnet parts in the rotating body 16 along the circumference of this body. Alternative, such magnets can also be obtained by integrally molding a plastic cylindrical part and permanent magnets using a special molding technique such as an insert molding method or outsert molding method, etc. It is also possible to use unmagnetized permanent magnets, and to magnetize the N poles and S poles following molding.

Furthermore, it is also possible to obtain permanent magnets 22 that are integrated with the rotating body 16 by forming the rotating body 16 from a magnetic material, and magnetizing this body by a circumferential magnetization method so that N poles and S poles alternate at arbitrary angular intervals on the circumference.

The supporting carrier 30 has an internal diameter part that supports the outer circumference of the rotating body 16, and a width that matches the width of the parallel groove oriented in the direction of the Y axis that is formed by the stage 12 and the side guiding portion 14; and this supporting carrier 30 has the function of allowing a linear advance along the direction of the Y axis together with the rotating body 16, while supporting the rotating body 16 so that the rotating body 16 is free to rotate about its central axis of rotation. As shown in FIG. 2, the supporting carrier 30 can be constructed by two U-shaped members that have substantially semicircular internal diameter side guides. Of course, this may also be constructed by a member with an integral structure which has rotation supporting holes that correspond to the external diameter of the rotating body 16 in a rectangular member. Such a supporting carrier 30 can be obtained by working an appropriate metal material. Alternatively, as in the case of the rotating body, a plastic material may be used in some cases.

Figure 3A:
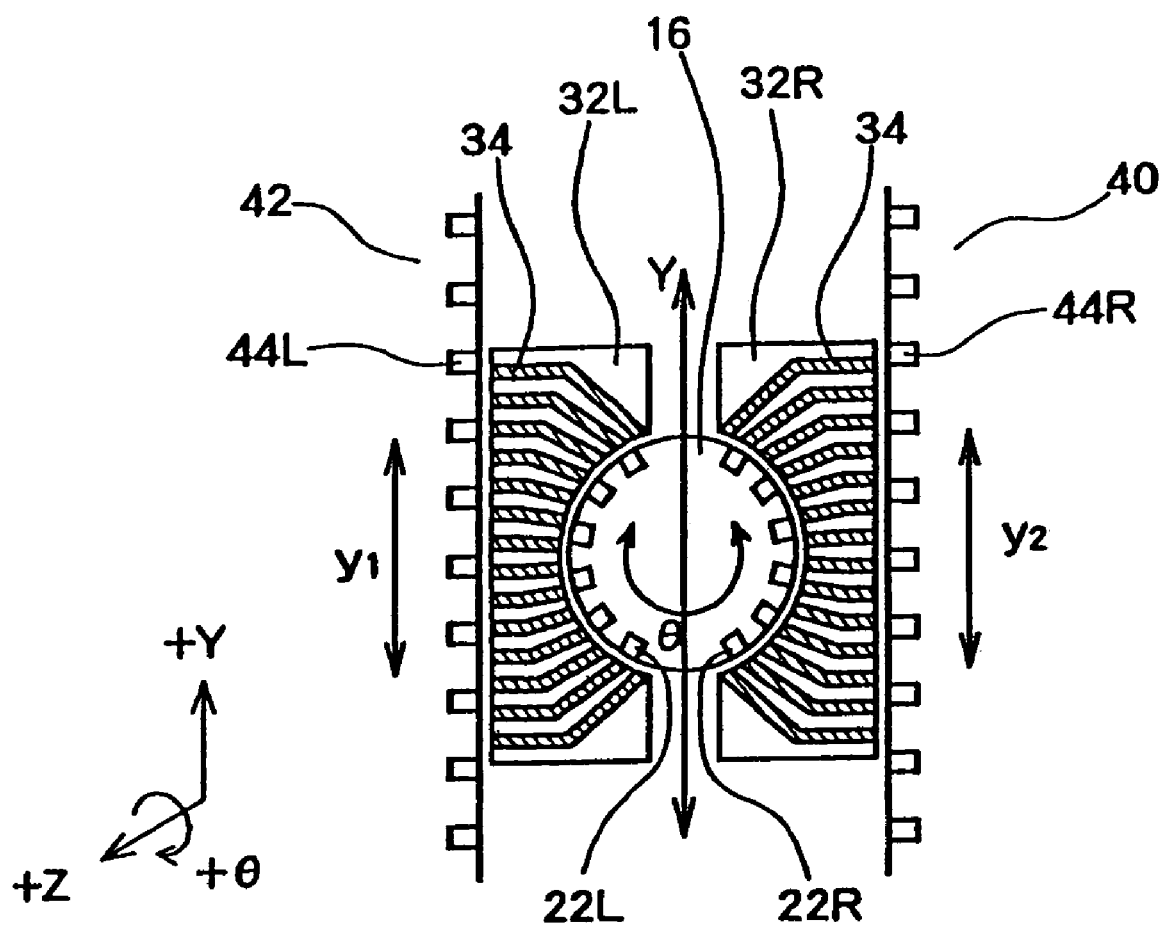
FIG. 3A is a diagram that shows how the rotating body moves while receiving a propulsive force or rotational torque as a result of the cooperative action between magnetic fields that move rectilinearly, which are formed by the driving of left and right coil portions, and a circumferential magnetic field formed by permanent magnets, in an embodiment of the present invention.

The magnetic path member 32 is a member which has a plurality of magnetic paths disposed between the permanent magnets 22 and the coil portions 40 and 42; this member has the function of changing the orientation of the magnetic fields between the circumferential magnetic field formed by the permanent magnets 22 and the two rectilinear magnetic fields formed by the coil portions 40 and 42. The conditions of the plurality of magnetic paths 34 formed in the magnetic path member 32 are shown in FIG. 3A. In FIG. 3A, the positions of the magnetic fields formed by the coil portions 40 and 42 and the magnetic field formed by the permanent magnets 22 are shown in model form. More specifically, the positions 44R of the magnetic poles such as the N poles and S poles, etc., created by the right coil portion 40, and the positions 44L of the magnetic poles such as the N poles and S poles, etc., created by the left coil portion 42, are formed parallel to the Y axis. In regard to the magnetic poles created by the permanent magnets 22, the positions 22R of the magnetic poles such as the right-side N poles and S poles, etc., and the positions 22L of the magnetic poles such as the left-side N poles and S poles, etc., are formed in a circumferential configuration. One set of magnetic path members 32 is formed as a right magnetic path member 32R and left magnetic path member 32L, and the magnetic paths 34 respectively formed in these members change the positions of the magnetic poles so that the positions 44R and 44L of the linearly disposed magnetic poles correspond to the positions 22R and 22L of the circumferentially disposed magnetic poles.

Such a magnetic path member 32 can be obtained by bonding a plate consisting of a magnetic material to the supporting carrier 30, and then forming slits by mechanical working. Furthermore, in the case of a small actuator or the like, a method such as pattern etching, etc., can be used to form the slits instead of mechanical working. For example, an electromagnetic steel plate or the like can be used as such a plate consisting of a magnetic material. Alternatively, an electromagnetic steel plate can be stamped by pressing into a connected shape so as to contain the desired plurality of magnetic path parts; then, this plate can be bonded to a non-magnetic base member having the same shape as the supporting carrier 30, and the end parts can be cut to produce the desired separated plurality of magnetic paths 34. It is desirable that the areas between the separated magnetic paths 34 be filled with a non-magnetic material such as a plastic, etc.

Furthermore, the magnetic path member 32 can also be obtained by using a laminated body consisting of a plurality of electromagnetic steel plates and non-magnetic plates. For example, electromagnetic steel plates and non-magnetic spacers with a height corresponding to the height of the magnetic path member 32 in the direction of the Z axis are alternately stacked, this assembly is bent and molded so that the orientation of the magnetic path portions created by the electromagnetic steel plates is bent, and the external shape is worked to produce the external shape of the magnetic path member 32. The working of the external shape may be working in which the end surface working of the rectilinear portions and semicircular shape is performed following molding using a plastic material.

Such a magnetic path member 32 has the function of changing the orientation of the magnetic fields so that the magnetic fields that are caused to move rectilinearly in the direction of the Y axis by the driving of the coil portions 40 and 42 are caused to move along the circumference of the rotating body 16, thus effecting a cooperative action with the magnetic fields created by the plurality of S and N magnetic poles formed by the permanent magnets 22, or changing the orientation of the magnetic fields so that the magnetic fields that are caused to rotate circumferentially by the rotation of the permanent magnets 22 are caused to move in the direction of the Y axis of the coil portions 40 and 42, thus effecting a cooperative action with the rectilinearly disposed magnetic fields formed by the coil portions 40 and 42. Furthermore, the magnetic fields formed by the coil portions and the magnetic fields formed by the permanent magnets 22 can make a cooperative action with respect to the propulsive force oriented in the direction of the Y axis in the plane where the coil portions 40 and 42 and the magnetic path member 32 face each other, and also can make a cooperative action with respect to the rotational torque in the circumferential direction in the plane where the permanent magnets 22 and magnetic path member 32 face each other.

The bottom surfaces of the rotating body 16 and supporting carrier 30 are worked into flat surfaces, and a fluid pressure supporting mechanism such as an air bearing or the like is installed between these surfaces and the flat surface of the stage 12. Also, the side surfaces of the supporting carrier 30 and the magnetic path member 32 are worked into flat surfaces, and a fluid pressure supporting mechanism such as an air bearing or the like is installed between these surfaces and the flat surface of the stage 12. For example, this fluid pressure supporting mechanism may be formed as a mechanism that performs the blowing out of air and vacuum suction between the upper surface of the stage 12 and the bottom surface of the rotating body 16. As a result, the bonding head 10 can advance linearly along the Y axis shown in FIG. 1 and rotate (as will be described below) while being supported by fluid pressure on the plane of the stage 12, so that the tip end of the bonding tool 18 or positioning camera 20 can be moved to arbitrary positions on the XY plane.

The manner in which rotating body 16 moves while receiving a propulsive force or rotational torque as a result of the cooperative action of the magnetic fields that move rectilinearly, which are formed by the driving of the coil portions 40 and 42, and the circumferential magnetic field formed by the permanent magnets 22, is shown in FIG. 3A. In accordance with the directions and magnitudes of linear motions $y_1$ and $y_2$ along the Y axis of the magnetic poles formed by the set of coil portions 40 and 42, the rotating body 16 makes a movement that combines a linear advance Y along the Y axis and a rotation $\theta$ about the Z axis. FIG. 3B shows five examples for the linear motions $y_1$ and $y_2$ of the magnetic pole positions of the coil portions 40 and 42.

The first example shows a case in which $y_1=y_2=+a$, i.e., a case in which the coil portion 40 and coil portion 42 cause the respective magnetic pole positions 44R and 44L to move linearly by the same amounts of movement in the same direction. In this case, the magnetic pole positions 44R and 44L are converted on the circumference of the rotating body 16 by the plurality of magnetic paths 34 so that the movement of the magnetic field oriented in the +Y direction that is created by the coil portion 40 is a rotational movement in the counterclockwise direction along the circumference of the rotating body 16, and so that the movement of the magnetic field oriented in the +Y axial direction that is created by the coil portion 42 is a rotational movement in the clockwise direction along the circumference of the rotating body 16. Accordingly, the rotational torque is canceled by the cooperative action between the magnetic path member 32 and the rotating body 16, so that no rotation is made. On the other hand, a propulsive force oriented in the same +Y direction is generated by the cooperative action between the coil portions 40 and 42 and the magnetic path member 32, so that a linear movement of +a is made along the Y axis.

The second example shows a case in which $y_1=y_2=-a$, i.e., a case in which the coil portion 40 and coil portion 42 cause the respective magnetic pole positions 44R and 44L to move linearly by the same amounts of movement in the opposite direction from the direction shown in the first example. In this case as in the case described in the first example, there is no rotation of the rotating body 16, and a linear motion of –a is made along the Y axis.

Thus, by causing the respective magnetic pole positions 44R and 44L of the coil portion 40 and coil portion 42 to move by the same amounts of movement in the same direction, i.e., by causing the respective magnetic fields to move by the same amount in the same direction, it is possible to cause the rotating body 16 to advance or retract in the direction of the Y axis by the same amount of movement and in the same direction as the linear movement of the magnetic fields created by the coil portions 40 and 42, without causing any rotation of the rotating body 16.

The third example shows a case in which $y_1=+b$ and $y_2=-b$, i.e., a case in which the coil portion 40 and coil portion 42 cause the respective magnetic pole positions 44R and 44L to move by the same amounts of movement (in terms of absolute value) in mutually opposite directions. In this case, the propulsive force is canceled by the cooperative action between the coil portions 40 and 42 and the magnetic path member 32, so that no linear movement is made. Meanwhile, the magnetic pole positions 44R and 44L are converted on the circumference of the rotating body 16 by the plurality of magnetic paths 34, so that the movement of the magnetic field oriented in the –Y axial direction that is created by the coil portion 40 is a rotational movement in the clockwise direction along the circumference of the rotating body 16, and so that the magnetic field created by the coil portion 42 also rotates in the clockwise direction along the circumference of the rotating body 16. Accordingly, a rotational torque oriented in the same direction is generated by the cooperative action between the magnetic path member 32 and the rotating body 16, so that the rotating body 16 rotates. If the width on the side of the coil portions 40 and 42 in the magnetic path member and the arc length on the side of the rotating body 16 are equal, then the angle of rotation is +b/r. The units are radians, and r is the radius of the rotating body 16.

The fourth example shows a case in which $y_1=-b$ and $y_2=+b$, i.e., a case in which the directions of movement of the respective magnetic pole positions 44R and 44L of the coil portion 40 and coil portion 42 are switched with respective to the third example. In this case as well, no linear movement is made by the rotating body 16, and a rotation of (–b/r) radians is made about the Z axis.

Thus, the rotating body 16 can be caused to rotate in the forward and reverse directions by an angle corresponding to the amount of movement of the magnetic fields created by the coil portions 40 and 42, without causing linear motion of the rotating body 16, by causing the linear movement of the respective magnetic pole positions 44R and 44L of the coil portion 40 and coil portion 42 by the same amount of movement in opposite directions, i.e., by causing the respective magnetic fields to move linearly by the same amount in mutually opposite directions.

The fifth example shows a case in which $y_1=+a$ and $y_2=+b$, i.e., a case in which the coil portion 40 and coil portion 42 cause the respective magnetic pole positions to move linearly by different amounts of movement in the same direction. The movement of the rotating body 16 in this case comprises a linear advance by an amount obtained by averaging both of the above-described amounts of movement, and rotation by an amount obtained by dividing the difference between the two amounts of movement by 2. The rotating body 16 also makes a movement that combines a linear advance and rotation in cases where the coil portion 40 and coil portion 42 cause the respective magnetic pole positions 44R and 44L to make respective linear movements by different amounts of movement (in terms of absolute value) in opposite directions.

Thus, the rotating body 16 can be caused to make a movement that combines a linear movement Y along the Y axis and a rotation θ about the Z axis by performing driving with respect to the set of coil portions 40 and 42 so that the respective magnetic fields move in a linear direction, and effecting a cooperating action with the circumferential magnetic field of the permanent magnets 22 via the magnetic path member 32.

Next, the action of the movement mechanism of the bonding head 10 in the wire bonder 8 constructed as described above will be described.

A specified bonding program is started in order to perform bonding work in the wire bonder 8. In accordance with the procedure of this program, for example, substrates on which chips have been die-bonded (or the like) are supplied, and are held in specified positions. Next, using means such as the positioning camera 20 or the like, the positions of the bonding pads on the chip that is to be bonded are detected, and the tip end of the bonding tool 18 is positioned in these positions. The movement mechanism of the bonding head 10 is used for this positioning. In concrete terms, the amount of movement (ΔX, ΔY) required in order to move the bonding tool 18 from an initial position to the target position is determined on the basis of data detected by the positioning camera 20, etc., and the amount of linear movement Y and amount of rotation 0 of the rotating body 16 corresponding to the above-described amount of movement is determined. Then, on the basis of the relationship illustrated in FIG. 3B, the amount of linear movement $y_1$ of the magnetic field formed by the right coil portion 40 and the amount of linear movement $y_2$ of the magnetic field formed by the left coil portion 42 that are required for the movement comprising the above-described amount of linear movement Y and amount of rotation θ are calculated. An appropriate conversion program can be used for these calculations.

As shown in FIG. 3A, if driving is performed for the set of coil portions 40 and 42 so that the respective magnetic fields move in a linear direction, and a cooperative action with the circumferential magnetic field of the permanent magnets 22 is effected via the magnetic path member 32, the rotating body 16 makes a movement that combines a linear movement Y along the Y axis and a rotation θ about the Z axis. As a result, the tip end of the bonding tool 18 mounted on the rotating body 16 moves in the XY plane along a track that combines a straight line and a circular arc. This track can be associated with the amount of linear movement $y_1$ of the magnetic field in the right coil portion 40 and the amount of linear movement $y_2$ of the magnetic field in the left coil portion 42 on the basis of the positional relationship between the radius r of the rotating body 16 and the tip end of the bonding tool 18 with respect to the center of rotation of the rotating body 16. Accordingly, if the amount of movement ΔX, ΔY of the bonding tool 18 and the amounts of linear movement $y_1$, $y_2$ of the respective magnetic fields in the respective coil portions 40 and 42 are associated, and this relationship is formed into an appropriate program, the required linear movement amounts $y_1$, $y_2$ can be obtained by giving the amount of movement ΔX, ΔY. The driving conditions such as the driving current, etc., of the coil portions 40 and 42 are determined on the basis of the amounts of linear movement $y_1$, $y_2$ of the respective magnetic fields in the coil portions 40 and 42 thus obtained.

If the coil portions 40 and 42 are driven in accordance with the driving conditions thus obtained, the magnetic field created by the left coil portion 42 moves by $y_1$, and the magnetic field created by the right coil portion 40 moves by $y_2$. Furthermore, the orientation of the magnetic fields is changed to the circumferential direction of the rotating body 16 by the magnetic path member 32, and a cooperative action is effected with the magnetic field disposed in the circumferential direction of the permanent magnets 22, so that the rotating body 16 makes a linear movement Y and a rotation θ. In this case, if a construction is used in which the center of gravity of the bonding head 10 as a whole substantially coincides with the center of rotation of the rotating body 16, the driving force that is generated by the above-described cooperative action can be efficiently transmitted to the center of gravity of the bonding head 10 as a whole. Thus, as a result of the cooperative action of the overall magnetic field of the respective magnetic poles created by the coil portions 40 and 42 and the overall magnetic field of the respective magnetic poles created by the permanent magnets 22, the tip end of the bonding tool 18 can be efficiently moved at a high speed by a distance of (ΔX, ΔY), so that this tip end can be moved to the desired position.

In the above construction, the permanent magnets 22 are installed in a circumferential configuration on the rotating body 16, and the coil portions 40 and 42 are installed on the outer sides of this rotating body 16. However, it is also possible to install coils on the rotating body 16, and to install two rows of permanent magnets 22 on the outer sides of this assembly. In this case, left and right coils may be installed in positions corresponding to the right-side magnetic pole positions 22R and left-side magnetic pole positions 22L of the permanent magnets in FIG. 3A, and left and right permanent magnets may be installed in positions corresponding to the magnetic pole position 44R of the right coil portion and the magnetic pole position 44L of the left coil portion.

Figure 4:
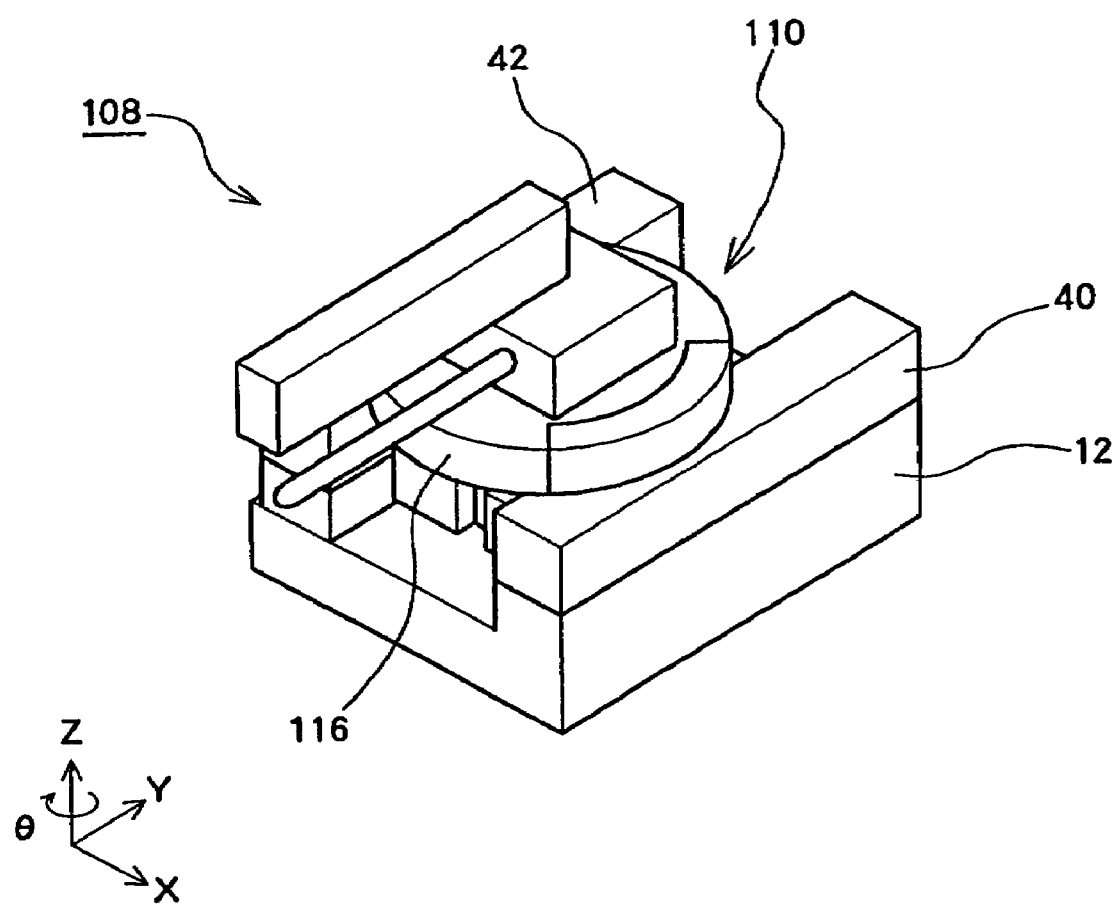
FIG. 4 is a partial diagram of a wire bonder in another embodiment of the present invention, particularly showing the part of the movement mechanism that moves the bonding head.
Figure 5:
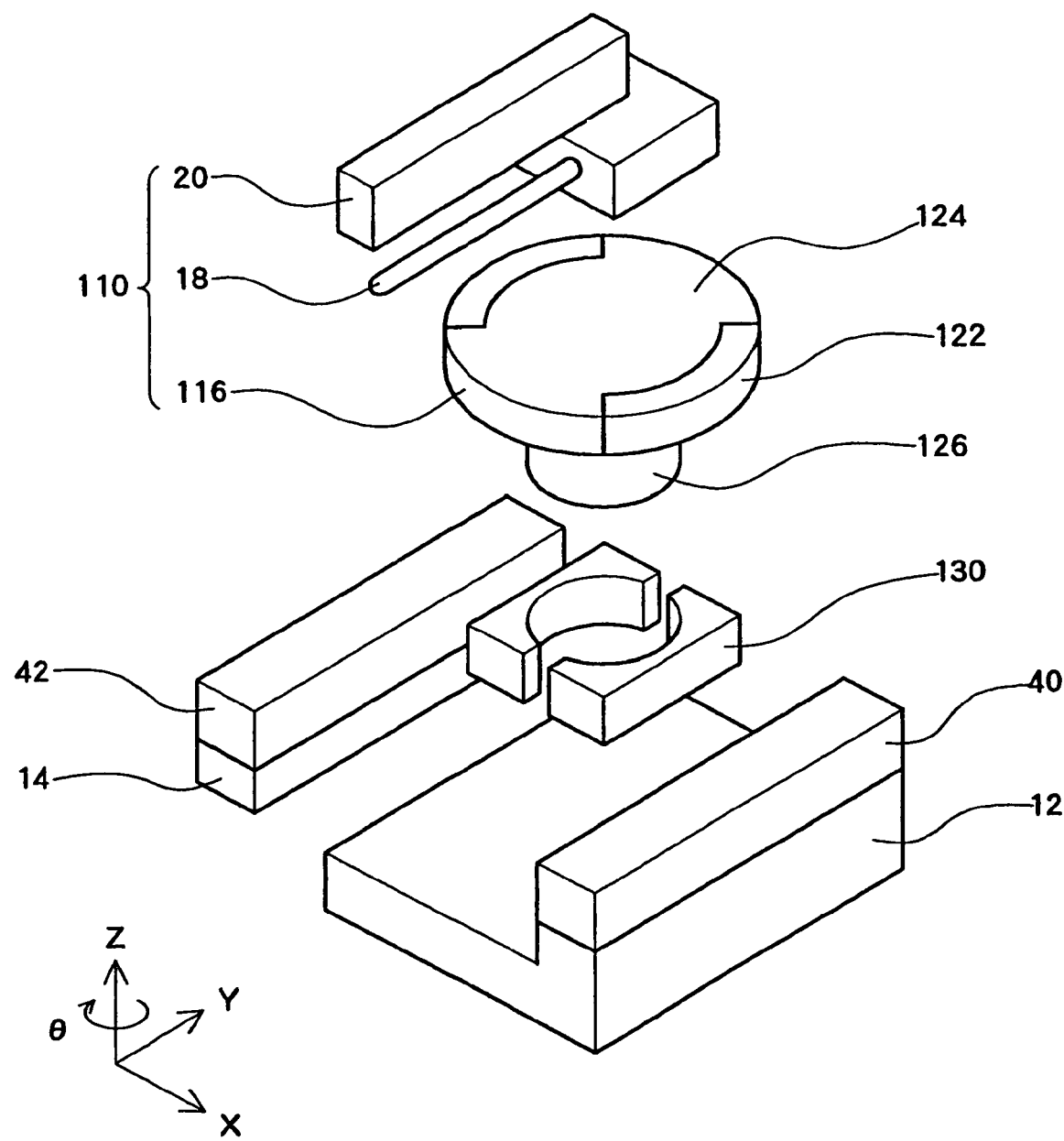
FIG. 5 is an exploded perspective view of FIG. 4.

In the embodiment shown in FIGS. 1 through 3, a cooperative action between the magnetic fields created by the coil portions 40 and 42 and the magnetic field created by the permanent magnets 22 is effected via the magnetic path member 32. However, it is also possible to install the left and right coil portions and permanent magnets in closer proximity to each other, and to effect a cooperative action directly between the magnetic fields of the left and right coil portions and the magnetic field of the permanent magnets. FIG. 4 is a diagram showing a portion of the movement mechanism for the bonding head 110 of a wire bonder 108 having such a construction, and FIG. 5 is an exploded view of the same. Elements that are the same as in FIG. 1 are labeled with the same symbols, and a detailed description of such elements is omitted. In this embodiment, only the bonding head 110 and supporting carrier 130 differ from the construction shown in FIG. 1; here, a magnetic path member is not installed.

The rotating body 116 of the bonding head 110 consists of a disk part 124 with a large diameter and a shaft part 126 with a small diameter; permanent magnets 122 are installed on the circumferential part of the disk part 124 that protrudes outward from the shaft part 126. The supporting carrier 130 supports the shaft part 126 of the rotating body 116 so that this shaft part 126 is free to rotate. Furthermore, the diameter of the protruding circumferential part of the disk part 124 on which the permanent magnets are installed is set so as to cover the upper surfaces of the coil portions 40 and 42.

Accordingly, the magnetic fields created by the coil portions 40 and 42 and the magnetic field created by the permanent magnets 122 can accomplish a cooperative action directly without using a magnetic path member of the type shown in FIG. 1. Consequently, as in the above description, the rotating body 116 can be caused to make a movement that combines a linear movement along the Y axis and a rotation θ about the Z axis by performing driving for the set of coil portions 40 and 42 so that the respective magnetic fields are caused to move in a linear direction, and effecting a direct cooperative action with the circumferential magnetic field of the permanent magnets 122.

In the above description, an actuator part driving a rotating body so as to allow rotation and a linear movement along a specified linear-advance axis is used in a bonding apparatus; however, this actuator part may also be used in movement devices or positioning devices other than a bonding apparatus. Furthermore, as shown in FIG. 3A, the magnetic paths in the magnetic path member are symmetrically disposed on both side of the rotating body; accordingly, one set of fixed element side magnetism generating elements is formed as left and right coil portions disposed on both outer sides of the magnetic path member. However, it is also possible to form one set of fixed element side magnetism generating elements as a set in which both elements are disposed on the same side of the magnetic path member. For example, the magnetic field created by one set of movable element side magnetism generating elements disposed on the rotating body and the magnetic field created by one set of fixed element side magnetism generating elements disposed on the same side of the magnetic path member can be caused to act cooperatively by forming a construction in which the magnetic paths in the magnetic path member are folded back in a three-dimensional configuration.

Figure 6A:
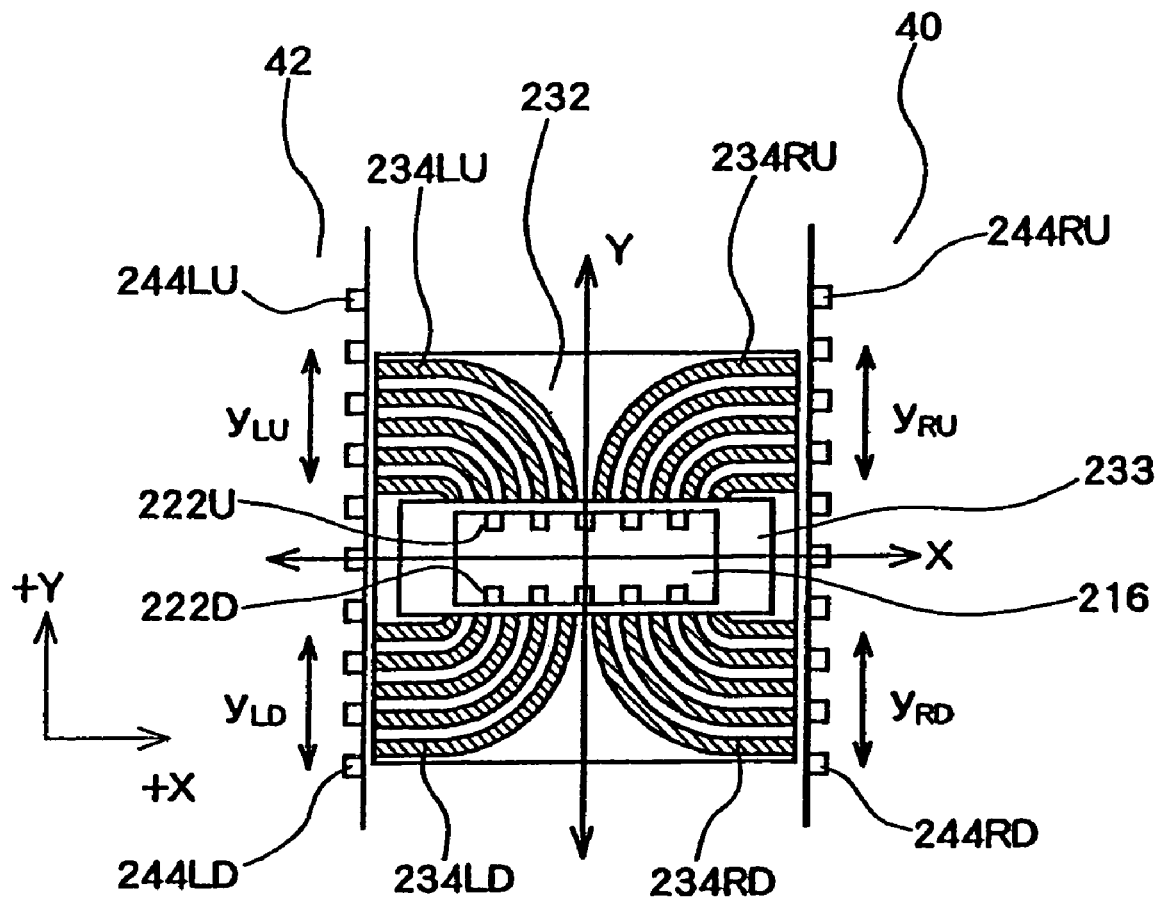
FIG. 6A is a diagram that shows the conditions of a movement mechanism using a magnetic path member which has magnetic paths that convert a magnetic pole disposition oriented in the direction of the Y axis into a magnetic pole disposition oriented in the direction of the X axis in another embodiment of the present invention.

The magnetic path member in FIGS. 1 through 3 is used to convert a rectilinear magnetic pole disposition into a circumferential magnetic pole disposition, thus converting the linear movement of the magnetic fields created by the left and right coils into a circumferential movement. It is also possible to convert the rectilinear magnetic pole disposition into a rectilinear magnetic pole disposition oriented in another axial direction by adjusting the pattern of the magnetic paths of the magnetic path member. FIG. 6A shows the conditions of a movement mechanism using a magnetic path member 232 which has magnetic paths 234 that convert a magnetic pole disposition oriented in the direction of the Y axis into a magnetic pole disposition oriented in the direction of the X axis which is at right angles with respect to the Y axis.

In such a movement mechanism, a guide groove 233 oriented in the direction of the X axis is formed in a supporting carrier which has the same shape as the magnetic path member 232, and a planar movement body 216 which is guided by the guide groove 233 is disposed in this groove. Permanent magnets 222 are disposed on the planar movement body 216 in two parallel rows on both sides along the direction of the X axis. By using the above-described magnetic path member 232 for this, the movement of the magnetic fields created by the coil portions 40 and 42 in the direction of the Y axis can be converted into the movement of magnetic fields oriented in the direction of the X axis, and the planar movement body 216 can be caused to make a movement in the XY plane that combines a movement in the direction of the X axis and a movement in the direction of the Y axis by means of a cooperative action with the magnetic field of the permanent magnets 222 of the planar movement body 216. Furthermore, a bonding tool or the like can be mounted on the planar movement body 216, so that this can be used in a bonding apparatus.

In the example shown in FIG. 6A, in regard to the control of the magnetic pole positions of the coil portions 40 and 42, these positions are respectively divided into upper and lower positions using the position of the planar movement body 216 as a reference. As shown in FIG. 6A, the magnetic pole position of the right coil portion 40 is divided into upper right and lower right positions, and the magnetic pole position of the left coil portion 42 is divided into upper left and lower left positions, and these positions are designated as respective magnetic pole positions 244RU, 244RD, 244LU and 244LD. Furthermore, the magnetic pole positions of the permanent magnets of the planar movement body 216 are divided into positions disposed along the upper side in the +Y direction, and positions disposed along the lower side in the −Y direction, and these positions are designated as respective magnetic pole positions 222U and 222D. Moreover, the movement of the magnetic pole position 244RU is designated as $y_{RU}$, the movement of the magnetic pole position 244RD is designated as $y_{RD}$, the movement of the magnetic pole position 244LU is designated as $y_{LU}$, and the movement of the magnetic pole position 244LD is designated as $y_{LD}$.

FIG. 6A illustrates how the planar movement body 216 moves by receiving a propulsive force in the Y direction or a propulsive force in the X direction as a result of the cooperative action between rectilinear magnetic fields oriented in the direction of the Y axis that are created by the coil portions 40 and 42 and a rectilinear magnetic field oriented in the direction of the X axis that is created by the permanent magnets 222. The planar movement body 216 makes a movement that combines a linear movement Y along the Y axis and a linear movement X along the X axis in accordance with the directions and magnitudes of the linear movements $y_{RU}$, $y_{RD}$, $y_{LU}$ and $y_{LD}$ along the Y axis of the magnetic poles formed by the set of coil portions 40 and 42. In FIG. 6B, five examples are shown for the linear movements $y_{RU}$, $y_{RD}$, $y_{LU}$ and $y_{LD}$ of the respective magnetic pole positions.

The first example shows a case in which $y_{RU}=y_{RD}=y_{LU}=y_{LD}=+a$, i.e., a case in which the four magnetic pole positions 244RU, 244RD, 244LU and 244LD obtained by respectively dividing the coil portions 40 and 42 into upper and lower halves are all caused to move linearly by the same amount of movement in the +Y direction. For example, to describe the situation with regard to the right coil portion 40, the magnetic pole position 244RU is converted by the plurality of magnetic paths 234RU so that this position runs along the upper side of the planar movement body 216, thus causing the movement of the magnetic field oriented in the +Y direction that is created by the upper half of the right coil portion 40 to be converted into the movement of a magnetic field along the −X direction of the planar movement body 216. Meanwhile, the magnetic pole position 244RD is converted by the plurality of magnetic paths 234RD so that this position runs along the lower side of the planar movement body 216, thus causing the movement of the magnetic field oriented in the +Y axial direction that is created by the lower half of the right coil portion 40 to be converted into the movement of a magnetic field along the +X direction of the planar movement body 216.

In other words, the movement of the magnetic pole position 244RU and the movement of the magnetic pole position 244RD are converted into the movements of magnetic fields in mutually opposite directions along the X axis with respect to the planar movement body 216. Similarly, with regard to the left coil portion 42 as well, the movement of the magnetic pole position 244LU and the movement of the magnetic pole position 244LD are converted into the movements of magnetic fields in mutually opposite directions along the X axis with respect to the planar movement body 216. Accordingly, in the case of the cooperative action between the magnetic path member 232 and planar movement body 216, the propulsive forces in the X direction are canceled, so that no movement along the X axis is made. On the other hand, in the case of the cooperative action between the coil portions 40 and 42 and the magnetic path member 232, respective propulsive forces oriented in the same +Y direction are generated, so that a linear movement of +a is made along the Y axis. In this case, the planar movement body 216, the magnetic path member 232 and the supporting carrier that has the same shape as the magnetic path member 232 all move.

The second example shows a case in which $y_{RU}=y_{RD}=y_{LU}=y_{LD}=-a$, i.e., a case in which the four magnetic pole positions 244RU, 244RD, 244LU and 244LD are all caused to move linearly by the same amount of movement in the −Y direction, which is the opposite direction from that in the first example. In this case as well, in the same manner as that described in the first example, no movement in the X direction is made by the planar movement body 216, and a linear movement of −a is made along the Y axis.

Thus, the planar movement body 216 can be caused to advance or retract in the direction of the Y axis in the same direction and by the same amount of movement as the linear movements of the magnetic fields created by the respective magnetic pole positions 244RU, 244RD, 244LU and 244LD without being caused to move in the X direction, by causing the four magnetic pole positions 244RU, 244RD, 244LU and 244LD obtained by respectively dividing the coil portions 40 and 42 into upper and lower halves to move linearly in the same direction and by the same amounts of movement, i.e., by causing the respective magnetic fields to move in the same direction and by the same amounts of movement.

The third example shows a case in which $y_{RU}=y_{LD}=-b$ and $y_{RD}=y_{LU}=+b$, i.e., a case in which the magnetic pole position 244RU of the upper half of the right coil portion 40 and the magnetic pole position 244LD of the lower half of the left coil portion 42 are respectively linearly driven by the same amount of movement in the −Y direction, and the magnetic pole position 244RD of the lower half of the right coil portion 40 and the magnetic pole position 244LU of the upper half of the left coil portion 42 are respectively linearly driven by the same amount of movement in the +Y direction. For example, to describe the situation with regard to the right coil portion 40, the magnetic pole position 244RU is converted by the plurality of magnetic paths 234RU so that this position runs along the upper side of the planar movement body 216, thus causing the movement of the magnetic field in the −Y direction created by the upper half of the right coil portion 40 to be converted into the movement of a magnetic field along the +X direction of the planar movement body 216. Meanwhile, the magnetic pole position 244RD is converted by the plurality of magnetic paths 234RD so that this position runs along the lower side of the planar movement body 216, thus causing the movement of the magnetic field in the +Y axial direction created by the lower half of the right coil portion 42 to be converted into the movement of a magnet field in the +X direction of the planar movement body 216.

In other words, the movement of the magnetic pole position 244RU and the movement of the magnetic pole position 244RD are converted into the movements of magnetic fields in the same direction along the X axis with respect to the planar movement body 216. Similarly, with respect to the left coil portion 42 as well, the movement of the magnetic pole position 244LU and the movement of the magnetic pole position 244LD are converted into the movements of magnetic fields in the same direction along the X axis with respect to the planar movement body 216. Accordingly, in the case of the cooperative action between the magnetic path member 232 and the planar movement body 216, a propulsive force oriented in the X direction is generated, so that the planar movement body 216 moves in the direction of the X axis. If the width on the side of the coil portion 42 and the width on the side of the planar movement body 216 are equal in the magnetic path member 232, the amount of this movement is +b. On the other hand, in the case of the cooperative action between the coil portions 40 and 42 and the magnetic path member 232, the respective propulsive forces in the Y direction are canceled, so that no movement along the Y axis is made. In this case, only the planar movement body 216 moves in the guide groove 233; the magnetic path member 232 and the supporting carrier that has the same shape as this magnetic path member do not move.

The fourth example shows a case in which $y_{RU}=y_{LD}=+b$, and $y_{RD}=y_{LU}=-b$, i.e., a case in which the directions of movement of the respective magnetic pole positions are reversed from those in the third example. In this case as well, in the same manner as in third example described above, there is no movement of the planar movement body 216 in the Y direction; instead, a linear movement of −b is made along the X axis.

Thus, by taking the magnetic pole position 244RU of the upper half of the right coil portion 40 and the magnetic pole position 244LD of the lower half of the left coil portion 42 as one set, taking the magnetic pole position 244RD of the lower half of the right coil portion 40 and the magnetic pole position 244LU of the upper half of the left coil portion 42 as another set, and causing the respective sets to move linearly by the same amount of movement in mutually opposite directions, i.e., by causing the respective magnetic fields to move by the same amount of movement in opposite directions, it is possible to cause the planar movement body 216 to advance or retract in the direction of the X axis by an amount of movement corresponding to the amount of movement of the magnetic pole position 244RD of the lower half of the right coil portion 40 or the magnetic pole position 244LU of the upper half of the left coil portion 42, without causing the planar movement body 216 to move in the Y direction.

The fifth example shows a case in which $y_{RU}=y_{LD}=+b$ and $y_{RD}=y_{LU}=+a$, i.e., a case in which the magnetic pole position 244RU of the upper half of the right coil portion 40 and the magnetic pole position 244LD of the lower half of the left coil portion 42 are taken as one set, the magnetic pole position 244RD of the lower half of the right coil portion 40 and the magnetic pole position 244LU of the upper half of the left coil portion 42 are taken as another set, and the respective sets are caused to move linearly by different amounts of movement in the same direction. The movement of the planar movement body 216 in this case is a movement that combines a linear movement along the Y axis corresponding to the average of both of the above-described amounts of movement, and a linear movement along the X axis corresponding to an amount of movement that is obtained by dividing the difference between the two above-described amounts of movement by 2. Even if the mutual directions of movement are different, a movement that combines a linear movement along the Y axis and a linear movement along the X axis is similarly obtained.

In the example shown in FIG. 6A, the control of the magnetic pole positions of the coil portions 40 and 42 is made with this control respectively divided into upper and lower parts with the position of the planar movement body 216 as a reference. However, it is also possible to perform a similar operation using only the magnetic pole positions 244RU and 244RD of the right coil portion 40 or magnetic pole positions 244LU and 244LD of the left coil portion 42. For instance, in the first example, even if the equation of $y_{RU}=y_{RD}=+a$ is set, and driving is not performed for $y_{LU}$ and $y_{LD}$, the propulsive forces in the X direction are canceled by the cooperative action between the magnetic path member 232 and the planar movement body 216, so that no movement is made along the X axis, and a propulsive force oriented in the +Y direction is generated by the cooperative action between the right coil portion 40 and the magnetic path member 232, so that the planar movement body 216 moves linearly by +a along the Y axis. The same is true for the other examples from the second example on. Thus, the planar movement body 216 can be moved to an arbitrary location on the XY plane using the driving of only one of the coil portions, i.e., the right coil portion 40 or left coil portion 42.

Compared to a case in which the planar movement body 216 is moved to an arbitrary location on the XY plane using the driving of only the right coil portion 40 or left coil portion 42, the movement range of the planar movement body 216 can be expanded by using the coil portions 40 and 42 and performing driving with the respective magnetic pole positions divided into upper and lower positions with respect to the position of the planar movement body 216, In the embodiment shown in FIG. 6A, the movement of the planar movement body 216 can be converted into a combination of a movement along the X axis and a movement along the Y axis by controlling the directions and magnitudes of the linear movements of the magnetic fields created by the coil portions 40 and 42. Accordingly, driving based on an XY coordinate system can be performed without performing the coordinate conversion combining a straight line and circular arc used in the embodiment shown in FIGS. 1 through 3, so that driving control can be simplified.

Furthermore, in the above description, the magnetic path member changes the orientation of the magnetic fields by 90 degrees; however, it is also possible to change this orientation to some other arbitrary angle.

The above-described movement mechanism can be used in a bonding apparatus as an actuator part that drives the planar movement body so that this planar movement body can be moved to an arbitrary location on the XY plane. Furthermore, this actuator part can also be used in movement devices or positioning devices other than a bonding apparatus. Moreover, as shown in FIG. 6A, the magnetic paths in the magnetic path member are disposed symmetrically on both sides with respective to the Y axis; accordingly, one set of fixed element side magnetism generating elements is formed as left and right coil portions disposed on both outer sides of the magnetic path member; however, it is also possible to dispose one set of fixed element side magnetism generating elements on the same side of the magnetic path member. For example, it is also possible to effect a cooperative action between the magnetic fields of one set of movable element side magnetism generating elements disposed on the planar movement body and the magnetic fields of one set of fixed element side magnetism generating elements disposed on the same side of the magnetic path member by using a construction in which the magnetic paths in the magnetic path member are folded back in a three-dimensional configuration.

In the present invention, a movable element side magnetism generating element is disposed on a rotating body, the rotating body is supported by a supporting carrier so that the rotating body is free to rotate, and a fixed element side magnetism generating element is disposed on the outside of this supporting carrier. Furthermore, a magnetic path member which has a plurality of magnetic paths is disposed on the supporting carrier, and a circumferential magnetic field created by the movable element side magnetism generating element and a rectilinear magnetic field created by the fixed element side magnetism generating element act cooperatively via these magnetic paths. In other words, the magnetic path member has the function of converting the magnetic field orientation between a rectilinear magnetic field and a circumferential magnetic field; this member converts a magnetic field that moves rectilinearly into a magnetic field that rotates circumferentially, or converts a magnetic field that rotates circumferentially into a magnetic field that moves rectilinearly.

For example, in a case in which a movable element side magnetism generating element (permanent magnets) is disposed in a circumferential configuration on a rotating body, the rotating body is supported by a supporting carrier so that this rotating body is free to rotate, left and right fixed element side magnetism generating elements (coil portions) are disposed on both outer sides of this supporting carrier, and the side of the left and right fixed element side magnetism generating elements is driven, then by way of performing driving so that both rectilinear magnetic fields are driven by the same amount of movement in the same direction, since the magnetic fields are converted into magnetic fields that rotate in mutually opposite directions along the circumference of the rotating body by the magnetic path member, the torques of the rotational component are canceled by the cooperative action with the circumferential magnetic field of the movable element side magnetism generating element of the rotating body, and a propulsive force with a linear component is generated, thus causing the rotating body to move in a linear motion.

Furthermore, if driving is performed so that both rectilinear magnetic fields are driven by the same amount of movement in opposite directions, since the magnetic fields are converted into magnetic fields that rotate in the same direction along the circumference of the rotating body by the magnetic path member, the propulsive forces of the linear component are canceled by the cooperative action with the circumferential magnetic field, so that a torque with a rotational component is generated, thus causing the rotating body to rotate.

If the amounts of movement of the two rectilinear magnetic fields are different, the rotating body will make a movement that combines a linear advance and rotation along the linear-advance axis. In cases where the side of the movable element side magnetism generating element is driven as well, the rotating body can similarly be caused to make a movement consisting of a linear advance and rotation along the linear-advance axis by dividing the circumferential magnetic field between the left and right, and performing driving using a combination of respective rotational directions and amounts of rotational movement.

As seen from the above, in the present invention, by controlling the driving of the magnetism generating element on the fixed element side or movable element side, it is possible to move the rotating body to arbitrary positions. In such a movement mechanism, since the rotating body, supporting carrier, left and right fixed element side magnetism generating elements and the like do not have a stacked structure, the driving load can be reduced. Furthermore, for example, the respective magnetic fields created by the left and right fixed element side magnetism generating elements act cooperatively as a whole with the magnetic field created by the movable element side magnetism generating element so that a propulsive force or torque is applied to the rotating body or supporting carrier; accordingly, there is no case in which when one fixed element side magnetism generating element is in operation, the other fixed element side magnetism generating element is idle, and there is no instance in which the load is a load on one fixed element side magnetism generating element. Thus, in regard to the cooperative action of the magnetic fields, more efficient driving can be obtained. Accordingly, the rotating body or the bonding head mounted on the rotating body can be moved to arbitrary positions at a higher speed.

Furthermore, in the present invention, the movable element side magnetism generating element is disposed on a planar movement body parallel to a first axial direction, the planar movement body is supported by a supporting carrier so that the planar movement body can be freely guided in this first axial direction, and a fixed element side magnetism generating element is disposed on the outside of the supporting carrier parallel to a second axial direction which is at opposite from the first axial direction. Furthermore, a magnetic path member which has a plurality of magnetic paths is disposed on the supporting carrier, and both rectilinear magnetic fields parallel to the first axial direction, which are created by the movable element side magnetism generating element, and the rectilinear magnetic field parallel to the second axial direction, which is created by the fixed element side magnetism generating element, act cooperatively via these magnetic paths.

In other words, the magnetic path member has the function of converting the magnetic field orientation between a rectilinear magnetic field in one (first) axial direction and a rectilinear magnetic field in the other (second) axial direction; the magnetic path member converts a magnetic field that moves rectilinearly in the first axial direction into a magnetic field that moves rectilinearly in the second axial direction or converts a magnetic field that moves rectilinearly in the second axial direction into a magnetic field that moves rectilinearly in the first axial direction. For example, in cases where the first axis and the other axis are perpendicular to each other, the magnetic path member has the function of changing the orientation of the magnetic field by 90 degrees.

For example, a case will be described in which upper and lower movable element side magnetism generating elements are disposed on a planar movement body parallel to one (first) axial direction, the planar movement body is supported by a supporting carrier so that the planar movement body can be freely guided in the first axial direction, and a fixed element side magnetism generating element is disposed on the outside of the supporting carrier parallel to the other (second) axial direction which is the opposite from the first axial direction. In this case, when the side of the fixed element side magnetism generating element is driven, if the rectilinear magnetic field in the other axial direction is divided into upper and lower rectilinear magnetic fields on either side of the first axis of the planar movement body, and driving is performed so that the respective rectilinear magnetic fields move by the same amount of movement in the same direction, the magnetic fields are converted by the magnetic path member into magnetic fields that move in mutually opposite directions along the first axial direction above and below the planar movement body; accordingly, the propulsive force with a component in first axial direction is canceled by the cooperative action with both rectilinear magnetic fields oriented in the first axial direction in the upper and lower movable element side magnetism generating elements of the planar movement body, and a propulsive force with a component in the second axial direction is generated, so that the planar movement body moves in a linear advance in the second axial direction.

Furthermore, by way of performing the driving so that both the upper and lower rectilinear magnetic fields oriented in the other axial direction move in opposite directions by the same amount of movement, the magnetic fields are converted by the magnetic path member into magnetic fields that move in the same direction along the first axial direction above and below the planar movement body; accordingly, the propulsive force with a component in the second axial direction is canceled by the cooperative action with both rectilinear magnetic fields oriented in the first axial direction in the upper and lower movable element side magnetism generating elements of the planar movement body, so that a propulsive force oriented in the first axial direction is generated, thus causing the planar movement body to move in the first axial direction.

If the amounts of movement of the upper and lower rectilinear magnetic fields oriented in the other axial direction are different, the planar movement body will make a movement in a specified plane combining a linear advance in the second axial direction and a linear advance in the first axial direction. In a case where the side of the upper and lower movable element side magnetism generating elements of the planar movement body is driven as well, the planar movement body can similarly be caused to make a movement within this specified plane by performing driving that combines respective movement directions and amounts of movement.

Furthermore, the fixed element side magnetism generating elements can be disposed on both outer sides of the supporting carrier, and a set of left and right fixed element side magnetism generating elements that are disposed parallel to the second axial direction can be used. In this case, for each of the left and right fixed element side magnetism generating elements, the rectilinear magnetic field that is oriented in the second axial direction is divided into upper and lower rectilinear magnetic fields located on either side of the planar movement body. Furthermore, the movement of the four upper and lower rectilinear magnetic fields is driven. For example, driving is performed with the movement driving of the upper rectilinear magnetic field of the right fixed element side magnetism generating element and the movement driving of the lower rectilinear magnetic field of the left fixed element side magnetism generating element combined into one set, and with the movement driving of the lower rectilinear magnetic field of the right fixed element side magnetism generating element and the movement driving of the upper rectilinear magnetic field of the left fixed element side magnetism generating element combined into another set. By doing this, it is possible to expand the movement range of the planar movement body.

Thus, the planar movement body can be moved to arbitrary positions by controlling the driving of the magnetism generating elements on the fixed element side or movable element side. In such a movement mechanism, since the planar movement body, supporting carrier, left and right fixed element side magnetism generating elements and the like do not have a stacked structure, the driving load can be reduced. Furthermore, for example, each of the upper and lower magnetic fields created by the fixed element side magnetism generating elements, or each of the respective magnetic fields created by the left and right fixed element side magnetism generating elements, act cooperatively as a whole with the magnetic field created by the movable element side magnetism generating element so that a propulsive force oriented in the first axial direction or second axial direction is applied to the planar movement body or supporting carrier; accordingly, there is no case in which when one fixed element side magnetism generating element is in operation, the other fixed element side magnetism generating element is idle, and there is no instance in which the load is a load on one fixed element side magnetism generating element. Thus, in regard to the cooperative action of the magnetic fields, more efficient driving can be obtained. Accordingly, the planar movement body or the bonding head mounted on the planar movement body can be moved to arbitrary positions at a higher speed.

Furthermore, in the present invention, the magnetic path member is constructed by alternately stacking a plurality of magnetic bodies and non-magnetic bodies. Accordingly, as a result of this stacking, a magnetic path member which has a plurality of magnetic paths can be obtained. Furthermore, in the present invention, a plurality of magnetic paths are separated by slit working of a magnetic body. Accordingly, as a result of this slit working, arbitrary magnetic path shapes can easily be obtained. Furthermore, in the present invention, the respective slits are filled with a non-magnetic material. Accordingly, separation of the respective magnetic paths can be sufficiently accomplished, so that cooperative action between the magnetic field created by the fixed element side magnetism generating element and the magnetic fields created by the upper and lower movable element side magnetism generating elements can be efficiently made, thus making it possible to improve the efficiency of driving.

Furthermore, in the present invention, the left and right fixed element side magnetism generating elements or the movable element side magnetism generating element are driven by an alternating current. In concrete terms, one of the magnetism generating elements is a permanent magnet, and an electromagnet obtained by passing a current through a coil can be used as the other magnetism generating element; here, a cooperative action between the magnetic field of the electromagnet and the magnetic field of the permanent magnet can be caused to take place by driving the coil with an alternating current. The coil may be installed on the side of the fixed element, or may be installed on the side of the movable element. Furthermore, in the present invention, the electromagnet is equipped with a core. As a result, a cooperative action with other magnetic fields can be effected by efficiently conducting the magnetic field generated by the electromagnet to the vicinity of the magnetic path member, so that the efficiency of driving can be improved.

In the present invention, the fixed element side magnetism generating element is formed as a coil. Accordingly, a driving control part which applies a driving current to the coil and controls the direction of movement and amount of movement of the magnetic field that is generated, can be installed on the fixed side, so that the overall construction can be simplified compared to a case where this control part is installed on the movable side.

Furthermore, the rotating body is supported by a fluid pressure supporting mechanism. As a result, the load of the movement of the rotating body to arbitrary positions can be reduced, so that higher-speed movement can be accomplished.

Furthermore, the plurality of permanent magnets are disposed on the rotating body in a circumferential configuration, the rotating body is supported on a supporting carrier so that the rotating body is free to rotate, and a set of left and right coils are disposed on both outer sides of the supporting carrier. In this construction, the magnetic fields created by the set of left and right coils can be directly caused to act cooperatively with the magnetic field of the permanent magnets, so that the magnetic path member can be omitted, thus making it possible to obtain a simpler construction.

As seen from the above description, according to the actuator and bonding apparatus of the present invention, the movement mechanism does not have a stacked construction such as that of an XY table system or slide and rotary system; accordingly, the object such as a bonding head or the like can be moved to arbitrary positions at a higher speed.

The invention claimed is:

1. An actuator comprising:
  a rotating body which can rotate and advance linearly along a specified linear-advance axis,
  a movable element side magnetism generating element which is disposed on the rotating body,
  a supporting carrier which supports the rotating body so that the rotating body is free to rotate, said supporting carrier being movable along the linear-advance axis together with the rotating body,
  a fixed element side magnetism generating element which is disposed along a direction of the linear-advance axis on an outside of the supporting carrier, and
  a magnetic path member which is disposed on the supporting carrier and has a plurality of magnetic paths that are formed between a circumferential magnetic field that is created by the movable element side magnetism generating element and a rectilinear magnetic field of the fixed element side magnetism generating element; and
  wherein said rotating body is caused to make a movement combining a linear advance and rotation by a cooperative action of a magnetic field created by said movable element side magnetism generating element and magnetic field created by said fixed element side magnetism generating element.

2. A bonding apparatus comprising:
  a rotating body which contains a bonding head that performs bonding on a bonding object and which can rotate and advance linearly along a linear-advance axis,
  a movable element side magnetism generating element which is disposed in a circumferential configuration on the rotating body,
  a supporting cater which supports the rotating body so that the rotating body is free to rotate, the supporting carrier being movable along the linear-advance axis together with the rotating body,
  a set of fixed element side magnetism generating elements which are disposed along a direction of the linear-advance axis on both outer sides of the supporting carder, and
  a magnetic path member which is disposed on the supporting carrier and has a plurality of magnetic paths that are formed between a circumferential magnetic field that is created by the movable element side magnetism generating clement and respective rectilinear magnetic fields of the fixed element side magnetism generating elements; and
  wherein said rotating body is caused to make a movement combining a linear advance and rotation by a cooperative action of a magnetic field created by said movable element side magnetism generating element and magnetic fields created by said fixed element side magnetism generating elements.

3. The bonding apparatus according to claim 2, wherein said magnetic paths member is formed by laminating a plurality of magnetic bodies that form magnetic paths and a plurality of non-magnetic bodies that separate the magnetic paths.

4. The bonding apparatus according to claim 2, wherein said magnetic path member is a magnetic body in which a plurality of slits are formed in a direction that forms magnetic pats.

5. The bonding apparatus according to claim 4, wherein each of said plurality of slits are filled with a non-magnetic material.

6. The bonding apparatus according to claim 2, wherein said fixed element side magnetism generating elements or movable element side magnetism generating element are driven by an alternating current.

7. The bonding apparatus according to claim 6, wherein said movable element side magnetism generating element is a permanent magnet, and said fixed element side magnetism generating elements are electromagnets.

8. The bonding apparatus according to claim 7, wherein said electromagnets have cores.

9. The bonding apparatus according to claim 2, wherein said movable element side magnetism generating element comprises a row of permanent magnets disposed in a circumferential configuration around said rotating body, and
  said fixed element side magnetism generating elements comprise two rows of permanent magnets that are disposed along a direction of said linear-advance axis.

10. The bonding apparatus according to claim 2, wherein at least one of said rotating body and said supporting carrier is supported by a fluid pressure supporting mechanism.

11. A bonding apparatus comprising:
  a rotating body which contains a bonding head that performs bonding on a bonding object, the rotating body being able to rotate and advance linearly along a specified linear-advance axis, a plurality of permanent magnets that are disposed in a circumferential configuration on the rotating body, a supporting carrier which supports the rotating body so that the rotating body is free to rotate, the supporting carrier being able to move together with the rotating body along the linear-advance axis, and a set of coils that are respectively disposed along a direction of the linear-advance axis on both outer sides of the supporting carrier;

magnetic path members disposed on said supporting carrier for changing the orientation of magnetic fields between a circumferential magnetic field formed by said plurality of permanent magnets and two rectilinear magnetic fields formed by said set of coils; and wherein said rotating body is caused to make a movement combining a linear advance and rotation by a cooperative action of magnetic fields that are created by causing an electric current to flow to said coils and by magnetic fields of said permanent magnets.

* * * * *